US012754268B2

(12) United States Patent
Kim

(10) Patent No.: US 12,754,268 B2
(45) Date of Patent: Oct. 6, 2026

(54) MAGNETIC RESONANCE IMAGING METHODS FOR DEPICTING MIXTURES OF CHEMICALLY SHIFTED AND ON-RESONANCE MOIETIES

(71) Applicant: Duke University, Durham, NC (US)

(72) Inventor: Raymond Kim, Durham, NC (US)

(73) Assignee: Duke University, Durham, NC (US)

( * ) Notice: Subject to any disclaimer, the term of this patent is extended or adjusted under 35 U.S.C. 154(b) by 129 days.

(21) Appl. No.: 18/871,137

(22) PCT Filed: May 31, 2023

(86) PCT No.: PCT/US2023/067704
§ 371 (c)(1),
(2) Date: Dec. 2, 2024

(87) PCT Pub. No.: WO2023/235760
PCT Pub. Date: Dec. 7, 2023

(65) Prior Publication Data

US 2026/0079223 A1 Mar. 19, 2026

Related U.S. Application Data

(60) Provisional application No. 63/347,747, filed on Jun. 1, 2022.

(51) Int. Cl.
*G01R 33/48* (2006.01)
*G01R 33/485* (2006.01)
*G01R 33/561* (2006.01)

(52) U.S. Cl.
CPC ....... *G01R 33/485* (2013.01); *G01R 33/4828* (2013.01); *G01R 33/5613* (2013.01)

(58) Field of Classification Search
CPC .............. G01R 33/485; G01R 33/4828; G01R 33/5613; G01R 33/56563; G01R 33/50
See application file for complete search history.

(56) References Cited

U.S. PATENT DOCUMENTS 4,940,941 A 7/1990 Rzedzian
5,289,126 A * 2/1994 Mori .................... G01R 33/485 324/309

(Continued)

FOREIGN PATENT DOCUMENTS

WO 2006084125 A2 8/2006
WO 2012061839 A2 5/2012
WO 2023235760 A1 12/2023

OTHER PUBLICATIONS

Aquaro et al. J Magn Reson Imaging 2014;40:126-32.

(Continued)

*Primary Examiner* — G.M. A Hyder
(74) *Attorney, Agent, or Firm* — Barnes & Thornburg LLP

(57) ABSTRACT

The present disclosure describes, in part, a method for achieving depiction of mixtures of chemically shifted and on-resonance moieties using magnetic resonance imaging (MRI) technology. The method can use a steady-state free precession sequence that can be optimized so that the chemically shifted moiety is in an out-of-phase passband in relation to the on-resonance moiety. This feature can enable detection of tissues with a small amount of the chemically shifted moiety with high sensitivity, including but not limited to detecting fat and water when imaging an organ.

12 Claims, 9 Drawing Sheets

(56) References Cited

U.S. PATENT DOCUMENTS

| | | | | |
|---|---|---|---|---|
| 6,147,492 | A | 11/2000 | Zhang et al. | |
| 8,718,747 | B2 | 5/2014 | Bjørnerud et al. | |
| 9,007,061 | B2 | 4/2015 | Stuber et al. | |
| 9,664,760 | B2 | 5/2017 | James et al. | |
| 2005/0085713 | A1 * | 4/2005 | Reeder | G01R 33/4828 324/309 |
| 2005/0215882 | A1 | 9/2005 | Chenevert et al. | |
| 2011/0274331 | A1 | 11/2011 | Weng | |
| 2013/0194265 | A1 | 8/2013 | Rehwald et al. | |
| 2017/0350951 | A1 | 12/2017 | Samsonov | |
| 2021/0132170 | A1 | 5/2021 | Wang et al. | |

OTHER PUBLICATIONS

Azevedo, Clerio F., et al. "Assessment of myocardial lipomatous metaplasia using an optimized out-of-phase cine steady-state free-precession sequence: Validation and clinical implementation." NMR in Biomedicine 35.10 (2022): e4777., Dec. 14, 2021.

Bottomley, Paul A., et al. "In vivo solvent-suppressed localized hydrogen nuclear magnetic resonance spectroscopy: a window to metabolism?." Proceedings of the National Academy of Sciences 82.7 (1985): 2148-2152.

Campbell, Matthew S., Alper Duran, and Cihan Duran. "An Under-Recognized Sequela of Myocardial Infarction: Lipomatous Metaplasia." Cureus 12.9 (2020).

Cheniti, Ghassen, et al. "Post-myocardial infarction scar with fat deposition shows specific electrophysiological properties and worse outcome after ventricular tachycardia ablation." Journal of the American Heart Association 8.15 (2019): e012482.

Fujifilm ECHELON (https://hce.fujifilm.com/products/mri.html).

GE SIGNA™ MR (https://www.gehealthcare.com/products/magnetic-resonance-imaging?utm_medium=cpc&utm_source=google&utm_campaign=USC-PS-2021-REG-AlwaysOn&utm_term=mri%20machine&utm_content=12207541833&npclid=Cj0KCQjwwJuVBhCAARIsAOPwGAQJsuNQ4-2NnnSi3hWsb12qF2f7S8DF1QCxPQzsbDPFEPu1C4oKa0laApgSEALw_wcB&gcli).

Harrison, S.A., 2006. Liver disease in patients with diabetes mellitus. Journal of clinical gastroenterology, 40(1), pp. 68-76.

Hernando, Diego, et al. "Joint Estimation of Water/Fat Images and Field Inhomogeneity Map." Magnetic Resonance in Medicine: An Official Journal of the International Society for Magnetic Resonance in Medicine 59.3 (2008): 571-580.

Hitachi Oasis (https://imagecarecenters.com/mri-options/hitachi-oasis-high-field-open-mri/).

Hölmich, Lisbet R., et al. "Incidence of silicone breast implant rupture." Archives of Surgery 138.7 (2003): 801-806. (https://jamanetwork.com/journals/jamasurgery/fullarticle/395179).

https://www.cancer.gov/about-cancer/understanding/statistics.

https://www.cdc.gov/heartdisease/facts.htm.

Jalalabadi, Faryan, et al. "Breast implant utilization trends in USA versus Europe and the impact of BIA-ALCL publications." Plastic and Reconstructive Surgery-Global Open 9.3 (2021): e3449. (https://journals.lww.com/prsgo/Fulltext/2021/03000/Breast_Implant_Utilization_Trends_in_USA_versus.21.aspx).

Kaolawanich, Yodying, et al. "Native T1 mapping for the diagnosis of myocardial fibrosis in patients with chronic myocardial infarction." Cardiovascular Imaging 15.12 (2022): 2069-2079.

Kellman, Peter, et al. "Influence of Off-resonance in myocardial T1-mapping using SSFP based MOLLI method." Journal of Cardiovascular Magnetic Resonance 15.1 (2013): 63.

Kramer, Christopher M., et al. "Standart Kardiyovasküler Manyetik Rezonans Görüntüleme (KMR) Protokolleri: 2020 güncellemesi.".

Li, Zifu, et al. "Smart nanotherapeutic targeting of tumor vasculature." Accounts of chemical research 52.9 (2019): 2703-2712.

Lücke, C., Schindler, K., Lehmkuhl, L et al. Prevalence and functional impact of lipomatous metaplasia in scar tissue following myocardial infarction evaluated by MRI. Eur Radiol 20, 2074-2083 (2010). https://doi.org/10.1007/s00330-010-1791-x.

MRI Informtion for Industry (https://www.fda.gov/radiation-emitting-products/mri-magnetic-resonance-imaging/mri-information-industry ).

PCT International Search Report and Written Opinion for Application No. PCT/US2023/067704, mailed Nov. 22, 2023 (7 pages).

Philips MRI Machines 9 (https://www.USA.philips.com/healthcare/diagnostic-imaging/magnetic-resonance-imaging/mri-systems).

Reeder, Scott B., et al. "Water-fat separation with IDEAL gradient-echo imaging." Journal of Magnetic Resonance Imaging: An Official Journal of the International Society for Magnetic Resonance in Medicine 25.3 (2007): 644-652.

Reeder, Scott B., Houchun H. Hu, and Claude B. Sirlin. "Proton density fat-fraction: a standardized MR-based biomarker of tissue fat concentration." Journal of magnetic resonance imaging: JMRI 36.5 (2012): 1011.

Rietjens, Mario, et al. "Appropriate use of magnetic resonance imaging and ultrasound to detect early silicone gel breast implant rupture in postmastectomy reconstruction." Plastic and reconstructive surgery 134.1 (2014): 13e-20e.

Shriki, Jabi E., et al. "Incidental myocardial infarct on conventional nongated CT: a review of the spectrum of findings with gated CT and cardiac MRI correlation." American Journal of Roentgenology 198.3 (2012): 496-504.

Siemens MAGNETOM Family (https://www.siemens-healthineers.com/en-us/magnetic-resonance-imaging).

Smith, R. C., Constable, R. T., Reinhold, C., McCauley, T., Lange, R. C., & McCarthy, S. (1994). Fast spin echo STIR imaging. Journal of computer assisted tomography, 18(2), 209-213.

Technicial Performance Assessment of Quantitative Imagining in Radiological Device Premarket Submission—Guidance for Industry and Food Adminstration Staff (https://www.fda.gov/media/123271/download).

* cited by examiner

MAGNETIC RESONANCE IMAGING METHODS FOR DEPICTING MIXTURES OF CHEMICALLY SHIFTED AND ON-RESONANCE MOIETIES

CROSS REFERENCE TO RELATED APPLICATIONS

This application is a U.S. national counterpart application of International Patent Application No. PCT/US2023/067704, entitled "MAGNETIC RESONANCE IMAGING METHODS FOR DEPICTING MIXTURES OF CHEMICALLY SHIFTED AND ON-RESONANCE MOIETIES," filed on May 31, 2023, which claims priority to and the benefit of U.S. Provisional Patent Application No. 63/347,747, entitled "Magnetic Resonance Imaging Methods for Depicting Mixtures of Chemically Shifted and On-Resonance Moieties," filed on Jun. 1, 2022, the content of each which is incorporated by reference herein in its entirety.

FIELD

The present disclosure relates to methods involving magnetic resonance imaging (MRI) technology, and more particularly methods that increase the conspicuity of mixtures of chemically shifted and on-resonance mixtures.

BACKGROUND

In the presence of a magnetic field, different chemical moieties may resonate at slightly different frequencies based on their local chemical environments. The degree of frequency separation between two molecular species is characterized by their chemical shift. The natural precession frequency of a spin system is also known as the Larmor frequency, and for clinical MRI, this generally refers to the resonance frequency of water. One example of a mixture of a chemically shifted moiety with an on-resonance moiety is the mixture of fat and water.

Fat is a chemically shifted moiety for which there is growing interest in the detection and quantification using a variety of magnetic resonance (MR) spectroscopy and MR imaging techniques. Fatty infiltration or metaplasia of tissues can be observed in pathological processes affecting a variety of organs including the liver (e.g., hepatic steatosis) and the heart (e.g., lipomatous metaplasia).

There are many approaches used to detect tissue fat including the use of sequences with and without chemically selective fat suppression and multiecho Dixon methods for fat-water separation. Fat suppression techniques attempt to separate tissue MR signal into its fat and water components by providing comparison of magnitude images acquired with and without chemical fat saturation (or selective water excitation) with otherwise identical imaging parameters. In the presence of fat, the signal should be higher on the nonfat-suppressed images compared with the fat-suppressed image and the difference in signal is attributed to fat. The saturation of fat is usually through a fat-frequency selective saturation recovery (SR) pulse played immediately before the readout of data. A major limitation of this technique, however, is that the complete and homogeneous suppression of the fat (or selective water excitation) throughout the organ of interest is very difficult to achieve due to inhomogeneities in the main magnetic field and the radiofrequency field that excites the spins, also known as B0 and B1 magnetic fields, respectively. This limitation is not limited to fat and would be true for any other chemically shifted moiety.

The short tau inversion recovery (STIR) sequence uses a non-frequency selective but usually spatially-selective inversion recovery (IR) pulse, which is coordinated to play at a specific time to null the fat at the beginning of the turbo spin-echo (TSE) readout. STIR suppresses fat relatively homogeneously because it is based on the longitudinal relaxation time of fat and is less dependent on B0 inhomogeneity. On the other hand, due to the IR pulse and the short inversion time, it has a reduced signal-to-noise ratio (SNR), has T1 weighting that may not be desirable, and the signal suppression is not specific to fat at least because it suppresses all tissues with similar T1 relaxation time as fat.

The Spectral Selection Attenuated Inversion Recovery (SPAIR) and Spectral Presaturation Inversion Recovery (SPIR) sequences work similar to STIR but the non-frequency selective IR pulse is replaced by a fat-frequency selective pulse. Compared to the STIR sequence, these sequences make the signal suppression more specific to fat, but an important limitation, similar to chemical fat saturation techniques, is that B0 and B1 magnetic field inhomogeneities make complete and homogeneous suppression of fat throughout the organ of interest difficult.

Chemical shift-based techniques separate the MR signal into water and fat components by acquiring gradient-recalled echo (GRE) images at two or more echo times (TEs). Rather than suppressing fat signal or selectively exciting water, this class of techniques, also known as "Dixon" fat-water separation, relies on phase shifts created by fat-water resonance frequency differences to separate fat from water. By strategically acquiring images at two or more specific TE values, the combined signal from a voxel, i.e., a three-dimensional pixel, containing fat and water signals can be decomposed into separate fat and water images. The original approach required only two TEs, one in which fat and water were "in-phase" and one in which they were "out-of-phase," thus it is also known as the "two-point" Dixon method. More recently, multi-point methods leverage acquisitions at multiple TEs with the full complex data sets (rather than just magnitude data) and utilize sophisticated nonlinear estimation methods to more accurately separate the fat and water signals.

A significant limitation with all of the imaging techniques described so far, is that obtaining images with these sequences takes time to set up and run these extra sequences, time that is often limited for current MRI clinical protocols. Thus, even though these fat specific sequences are available, it would be impractical to routinely use these techniques to image the entire organ (or organs) of interest as part of a typical clinical MRI protocol. Not surprisingly, standard clinical cardiac MRI protocols generally do not include sequences specifically dedicated to imaging fat. Rather, these sequences are, at best, "optional" and typically only run in the rare situation where there is a specific clinical inquiry related to the detection of fat.

One sequencing approach that has been utilized more recently is steady-state free precession (SSFP) sequences. These sequences provide high signal-to-noise ratios, tissue contrast, and are rapid. SSFP sequences are also known as TrueFISP (fast imaging with steady-state precession), FIESTA (Fast Imaging Employing Steady-state Acquisition), and balanced-FFE (fast field echo) sequences. SSFP cine sequences depict large regions of homogeneous fat, such as subcutaneous or epicardial fat, as bright tissue.

While SSFP sequences have been employed in some MRI protocols, there are several issues with using conventional SSFP sequences to diagnose fatty infiltration of tissues. First, it is important to recognize that an issue related to the sensitivity of conventional SSFP sequences to diagnose fatty infiltration exists. Specifically, although, a region of homogeneous fat is generally bright (i.e., has higher signal intensity) compared to most other organ tissues without fat (e.g., myocardium, muscle, liver, spleen, brain, etc.), a more moderate degree of fatty infiltration results in tissue voxels with partial fat (e.g., a mixture of fat and water) that, in turn, results in an insufficient increase in image intensity to be detectable with conventional SSFP sequences.

A second issue relates to the physiological implications for detecting partial fat—a mixture of fat and non-fat tissue—as separate from detecting fat in general. For instance, fatty infiltration can alter the electrophysiological properties of the myocardium and may serve as substrate for ventricular arrhythmias and sudden death. However, the substrate for ventricular tachycardia re-entry circuits appear to require tissue heterogeneity, and it may well be that detecting a zone of partial fat is more critical than detecting a zone of homogeneous fat.

Accordingly, it would be advantageous to provide a methodology that permits a physician to distinguish between tissue with fatty metaplasia from normal healthy tissue (i.e., tissue without fatty metaplasia) while not requiring additional fat specific sequences to be run. Moreover, it would also be advantageous to provide a methodology that permits such a distinction even if there were only mild or moderate degrees of fatty infiltration. Still further, it would be advantageous to provide a methodology that specifically highlights regions of tissue with partial fat, in contradistinction to regions with complete or homogeneous fat.

SUMMARY

The embodiments of the present disclosure implement improved processes for employing SSFP sequences to depict chemically shifted and on-resonance moieties in MRI. The SSFP sequences of the present embodiments can be used to differentiate between chemically shifted and on-resonance moieties that can be used to distinguish between healthy and unhealthy tissues. In some embodiments, images of the moieties can be analyzed to determine a frequency difference between peaks of each moiety. Rather than discarding the data of the peak of the chemically shifted moiety, the peak of the chemically shifted moiety can instead be centered in an out-of-phase passband in relation to the on-resonance moiety. Placing the peaks out of phase from one another can enable detection of tissues with a small amount of the chemically shifted moiety with high sensitivity. Subsequent analysis of the data can provide for visual distinction between tissues and/or provide information with respect to fat content thereof.

The disclosed processes are primarily described in the context of depicting fat and water mixtures because such mixtures are useful in highlighting the advantageous nature of the disclosed techniques. However, references to fat and water mixtures in this context herein do not limit the scope of the present disclosure to depicting mixtures that include fat and/or water. Rather, the disclosed processes can be used in conjunction with almost any substance (i.e., not just fat) in a mixture that has a resonance frequency offset (e.g., chemically shifted) from an on-resonance moiety of another substance in the mixture (i.e., not just water). For example, the embodiments described herein can be adjusted to detect mixtures of silicone and water or fluorine and water because both silicone (i.e., the methyl groups of polydimethylsiloxane) and fluorine have a chemical shift from water. It will be appreciated that the resonance frequency offset of materials can be based on the on-resonance moiety that is selected. That is, once the on-resonance moiety is selected, any materials that have a resonance that is different from the on-resonance moiety will have the resonance frequency offset, or become off-resonance moieties. Accordingly, any examples of materials described herein are by no means limiting to the materials that can be used on accordance with the presently disclosed techniques and related systems.

The optimization process for the present embodiments includes the chemically shifted substance (e.g., fat) being out-of-phase with the on-resonance moiety (e.g., water). Additionally, the present embodiments can be used to detect chemical moieties that are the same but have different local environment. One example includes tissue water with different physiological characteristics. More specifically, if a magnetic susceptibility contrast agent (e.g., dysprosium complexes) is administered intravenously, then tissue water with high blood perfusion can have a chemical shift compared to tissue water with low blood perfusion, and the present embodiments can be tuned to depict mixtures of tissue with abnormal perfusion and normal perfusion.

Another feature of the present embodiments is that the optimized out-of-phase SSFP sequence can allow immediate visual distinction between tissues with partial fat—a mixture of fat and non-fat tissue—as separate from detecting complete or homogeneous fat. This results in high sensitivity to detecting even minor degrees of fatty infiltration at least because subtraction of signal, such as due to out-of-phase cancellation effect, can result in a non-linear amplification of the signal difference between areas with and without partial fat. More specifically, even though complete replacement of tissue with fat results in a bright (i.e., high signal) zone, mild degrees of fatty infiltration can paradoxically result in a dark zone, which can be easy to distinguish from both normal tissue and tissue with complete fatty infiltration.

The improved sensitivity of the present embodiments to detecting mild or moderate degrees of fatty infiltration can be demonstrated by the fact that the published studies concerning SSFP imaging of cardiac fatty metaplasia that pre-date this disclosure describe the fatty metaplasia as having an india-ink appearance. This means the central zone is bright and there is nearly complete replacement of tissue with fat. The embodiments of the present disclosure indicate that fatty metaplasia can be identified as an entirely dark myocardial region, and thus do not have an india-ink appearance. This suggests that, at least in some embodiments, fatty metaplasia can be comprised entirely, or at least substantially entirely, of voxels of tissue, all of which may contain a partial amount of fat. In an evaluation of a series of patients with cardiac fatty metaplasia performed in conjunction with the present disclosure, only a minority (33%) of patients were observed to have an india-ink appearance, while the rest had partial fat throughout the entire area of fatty metaplasia. This finding contrasts with published literature that utilizes conventional SSFP imaging, leading to a conclusion that previous techniques and determinations likely underestimate the true prevalence of myocardial fatty metaplasia. Accordingly, the present disclosure provides improved sensitivity to detecting fatty metaplasia, and thus allows for improved observations.

Various other features and advantages of the present disclosure will be made apparent from the following drawings and detailed description. It should be recognized that the fat proton spectrum is complicated, as the multiple hydrogen protons in fat typically have different chemical environments, experience different magnetic fields, and resonate at different frequencies. The present disclosure discusses methylene groups of fat because in human tissue the methylene spectral peak is usually the largest. However, the present disclosure can be used to depict a different fat moiety with a different chemical shift, similar to the way in which the present disclosure can be used to depict a different substance entirely (e.g., silicone rather than fat).

One exemplary method of magnetic resonance imaging to depict mixtures of chemically shifted and on-resonance moieties depicted in imaging includes applying a steady-state free precession sequence during operation of a magnetic resonance imaging (MRI) scanner and determining a frequency difference between a chemically shifted moiety of a mixture and an on-resonance moiety of the mixture for the MRI scanner. The method further includes calculating an ideal time to repeat (TR) value that centers a peak of the chemically shifted moiety in a passband that is out-of-phase with the on-resonance moiety and adjusting a TR value so that it approaches the ideal TR value in view of one or more constraints of the MRI scanner and so it is within an acceptable range of TR values. As a result, the centered peak of the chemically shifted moiety is a distance in frequency to a nearest passband border at least half that anticipated to be a spread in frequency due to B0 inhomogeneity for a target imaging region. The method further includes acquiring MRI data from the target imaging region after centering the on-resonance peak for the target imaging region.

Calculating an ideal TR value that centers the peak of the chemically shifted moiety can include centering the peak of the chemically shifted moiety in the first out-of-phase passband. In some embodiments, calculating an ideal TR value that centers the peak of the chemically shifted moiety can include centering the peak of the chemically shifted moiety in the second or higher out-of-phase passband. The method can include distinguishing two or more MRI images by one or more of inversion time, echo time, or preparation time to produce one or more parametric maps. The parametric map(s) can include at lest one of a T1 map, a T2 map, or a T1rho map.

The chemically shifted moiety of interest can be a component of fat. Alternatively, the chemically shifted moiety of interest may not be a component of fat. In some embodiments, the chemically shifted moiety of interest can be chemically shifted by administering a contrast agent.

Another exemplary method of magnetic resonance imaging to depict mixtures of chemically shifted and on-resonance moieties depicted in imaging includes applying a steady-state free precession sequence during operation of a magentic resonance imaging (MRI) scanner and determining a frequency difference between a chemically shifted moiety of a mixture and an on-resonance moiety of the mixture for the MRI scanner. The method further includes calculating an ideal time to repeat (TR) value that centers a peak of the chemically shifted moiety in a passband that is in-phase with the on-resonance moiety and adjusting a TR value so that it approaches the ideal TR value in view of one or more constraints of the MRI scanner and so it is within an acceptable range of TR values. As a result, the centered peak of the chemically shifted moiety is a distance in frequency to a nearest passband border at least half that anticipated to be a spread in frequency due to B0 inhomogeneity for a target imaging region. The method further includes acquiring MRI data from the target imaging region after centering the on-resonance peak for the target imaging region.

Calculating an ideal TR value that centers the peak of the chemically shifted moiety can include centering the peak of the chemically shifted moiety in the first in-phase passband. In some embodiments, calculating an ideal TR value that centers the peak of the chemically shifted moiety can include centering the peak of the chemically shifted moiety in the second or higher in-phase passband. The ideal TR value can be a first ideal TR value, with the method further including calculating a second ideal TR value that centers a peak of the chemically shifted moiety in a passband that is out-of-phase with the on-resonance moiety, and subtracting the first ideal TR value from the second ideal TR value.

BRIEF DESCRIPTION OF THE DRAWINGS

This disclosure will be more fully understood from the following detailed description, taken in conjunction with the accompanying drawings, in which.

DETAILED DESCRIPTION

Figure 1B:
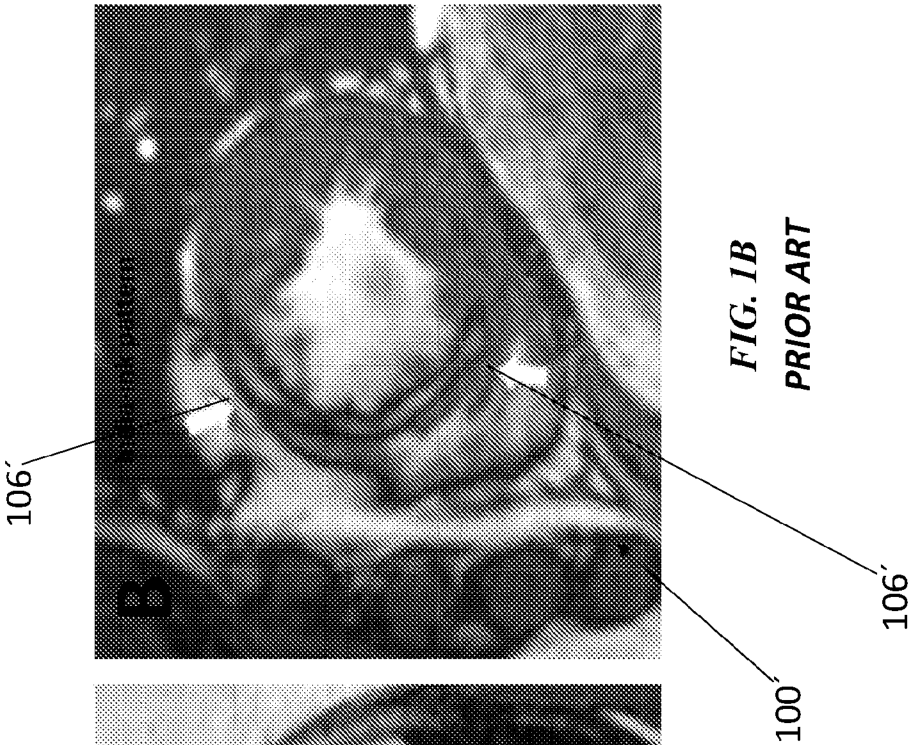
FIG. 1B PRIOR ART
FIG. 1B is a prior art SSFP image illustrating regions of relatively homogeneous fat within another example of a heart.

Certain exemplary embodiments will now be described to provide an overall understanding of the principles of the structure, function, manufacture, and use of the devices and techniques disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. Further, to the extent features, layers, sides, objects, steps, or the like are described as being "first," "second," third," etc., and/or "lower," "upper," "middle," etc., such numerical and/or location ordering/identification is generally arbitrary, and thus such numbering can be interchangeable unless indicated or otherwise understood by those skilled in the art to not be interchangeable.

Terms commonly known to those skilled in the art may be used interchangeably herein. By way of non-limiting example, the terms "chemically shifted moiety" and "off-resonance moiety" can be used interchangeably herein to refer to moieties that are in an out-of-phase passband in relation to an on-resonance moiety.

For the purposes of promoting an understanding of the principles of the present disclosure, reference will now be made to preferred embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e. at least one) of the grammatical object of the article. By way of example, "an element" means at least one element and can include more than one element.

"About" is used to provide flexibility to a numerical range endpoint by providing that a given value may be "slightly above" or "slightly below" the endpoint without affecting the desired result.

The use herein of the terms "including," "comprising," or "having," and variations thereof, is meant to encompass the elements listed thereafter and equivalents thereof as well as additional elements. As used herein, "and/or" refers to and encompasses any and all possible combinations of one or more of the associated listed items, as well as the lack of combinations where interpreted in the alternative ("or").

Moreover, the present disclosure also contemplates that in some embodiments, any feature or combination of features set forth herein can be excluded or omitted. To illustrate, if the specification states that a complex comprises components A, B and C, it is specifically intended that any of A, B or C, or a combination thereof, can be omitted and disclaimed singularly or in any combination.

Recitation of ranges of values herein are merely intended to serve as a shorthand method of referring individually to each separate value falling within the range, unless otherwise indicated herein, and each separate value is incorporated into the specification as if it were individually recited herein. For example, if a concentration range is stated as 1% to 50%, it is intended that values such as 2% to 40%, 10% to 30%, or 1% to 3%, etc., are expressly enumerated in this specification. These are only examples of what is specifically intended, and all possible combinations of numerical values between and including the lowest value and the highest value enumerated are to be considered to be expressly stated in this disclosure.

As used herein, the term "subject" and "patient" are used interchangeably herein and refer to both human and nonhuman animals. The term "nonhuman animals" of the disclosure includes all vertebrates, e.g., mammals and non-mammals, such as nonhuman primates, sheep, dog, cat, horse, cow, chickens, amphibians, reptiles, and the like. The methods and compositions disclosed herein can be used on a sample either in vitro (for example, on isolated cells or tissues) or in vivo in a subject (i.e. living organism, such as a patient).

Unless otherwise defined, all technical terms used herein have the same meaning as commonly understood by one of ordinary skill in the art to which this disclosure belongs.

The present application proceeds from the discovery that a steady-state free precession (SSFP) sequence can be developed in which parameters are set in one or more particular fashions using one or more specific protocols to provide an "optimized" SSFP sequence. More particularly, the optimized SSFP sequence is one in which a chemically shifted moiety (e.g., fat) is "out-of-phase" with an on-resonance moiety (e.g., water). The optimization process can provide a sequence that makes the chemically shifted moiety out-of-phase with the on-resonance moiety throughout the organ (or organs) of interest. This approach differs from published literature (see, e.g., Lucke et al. Eur Radiol 2010; 20:2074-83; Shriki et al. Can J Cardiol 2011; 27:664.e17-664.e23). For example, the present disclosure recognizes that signal cancellation at interfaces between chemically shifted and on-resonance moieties (e.g., fat-water interfaces) throughout the organ of interest is not an inherent feature of SSFP sequences. The present embodiments also proceed from the discovery that an optimized out-of-phase SSFP sequence can be used to detect tissues with mixtures of chemical moieties (e.g., tissues with fatty metaplasia) while also simultaneously providing the standard imaging of tissue anatomy, structure, and function of a conventional SSFP sequence. Hence, compared to currently available fat specific magnetic resonance imaging (MRI) sequences (e.g., fat sat sequences or n-point DIXON sequences), the present embodiments have the time saving advantage of not requiring additional sequences to be run beyond those already run as part of the "core" exam.

The present disclosure provides, in part, a method for achieving depiction of mixtures of chemically shifted and on-resonance moieties using MRI technology. In some embodiments, the methods can use an SSFP sequence that is optimized so that the chemically shifted moiety is in an out-of-phase passband in relation to the on-resonance moiety. This can be particularly useful as it enables detection of tissues with a small amount of the chemically shifted moiety with high sensitivity. Various other features and advantages of the present embodiments will be made apparent from the detailed description and accompanying figures.

The presently disclosed subject matter is described with specificity to meet statutory requirements. However, the description itself is not intended to limit the scope of this disclosure. Rather, the claimed subject matter might also be embodied in other ways, to include different steps or elements similar to the ones described herein, in conjunction with other present or future technologies. Moreover, although the term "step" may be used herein to connote different aspects of methods employed, the term should not be interpreted as implying any particular order among or between various steps herein disclosed unless and except when the order of individual steps is described as explicitly required in that order.

A person skilled in the art will recognize that the presently disclosed subject matter is not limited to the specific methods and instrumentalities disclosed in the drawings. As an example, the drawings show images of the heart. However, it is known that fatty infiltration of other organs can occur and that the herein-described embodiments can be applicable to other organs, e.g., liver, brain, stomach, intestines, spleen, and so forth. As another example, the present embodiments can be used to depict mixtures of substances other than fat with water. A person skilled in the art, in view of the present disclosure, will understand other mixtures that have moieties with which the disclosed techniques can be used, including but not limited to other examples provided for herein (see, e.g., the Background section above).

Figure 1A:
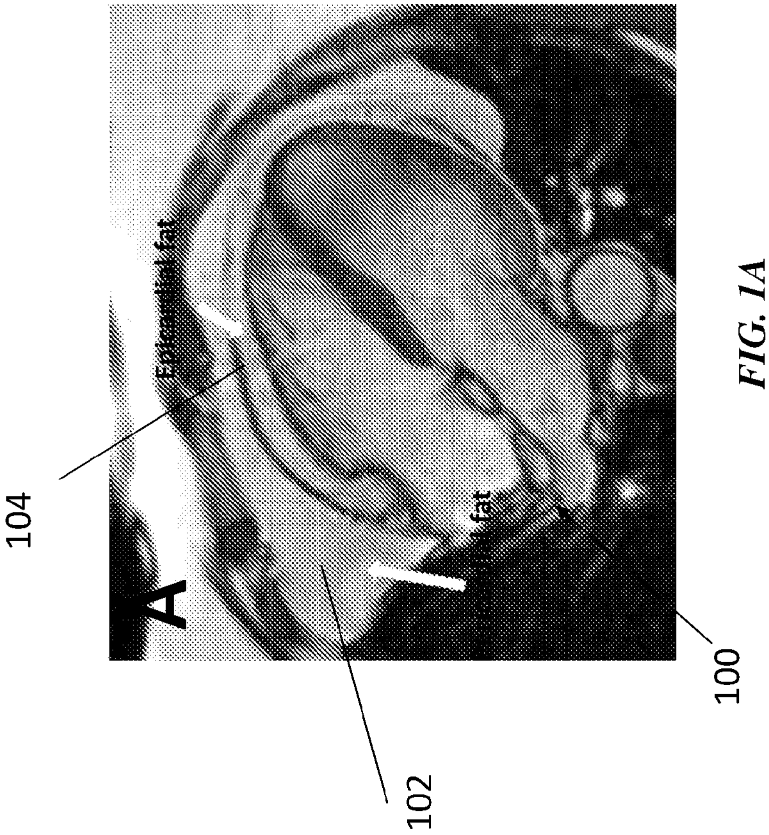
FIG. 1A PRIOR ART
FIG. 1A is a prior art SSFP image illustrating regions of relatively homogeneous fat surrounding a heart.

FIG. 1A is a prior art SSFP image of a heart 100. The image demonstrates that large regions of homogeneous fat outside the heart (also referred to as the heart muscle) can be detected on SSFP cine images as bright tissue. In the illustrated embodiment, the homogeneous fat includes subcutaneous fat, and more particularly pericardial fat 102 and epicardial fat 104. FIG. 1B illustrates that large areas of homogeneous fat 106' in a heart 100' within the heart muscle (i.e., myocardium) may present as a central bright region encircled by a dark low-signal line, so-called india-ink pattern (arrows) as known to those skilled in the art. A novel feature of the present embodiments concerns recognition that the india-ink pattern is not a constant feature of SSFP imaging. Specifically, the dark line at the border that represents the fat-water interface only occurs when fat and water resonances have opposite phase and there is destructive interference of fat and water signals through a partial volume effect. Unfortunately, prior studies employing SSFP imaging to diagnose lipomatous metaplasia assume that signal cancellation at fat-water interfaces is an inherent feature of SSFP sequences and does not use any special conditions or consideration of sequence parameters, or they believe, as it turns out incorrectly, that simply setting TE=TR/2 (where TR is the repetition time or time to repeat) will result in an SSFP sequence for which fat and water are out-of-phase.

Figures 2A, 2B:
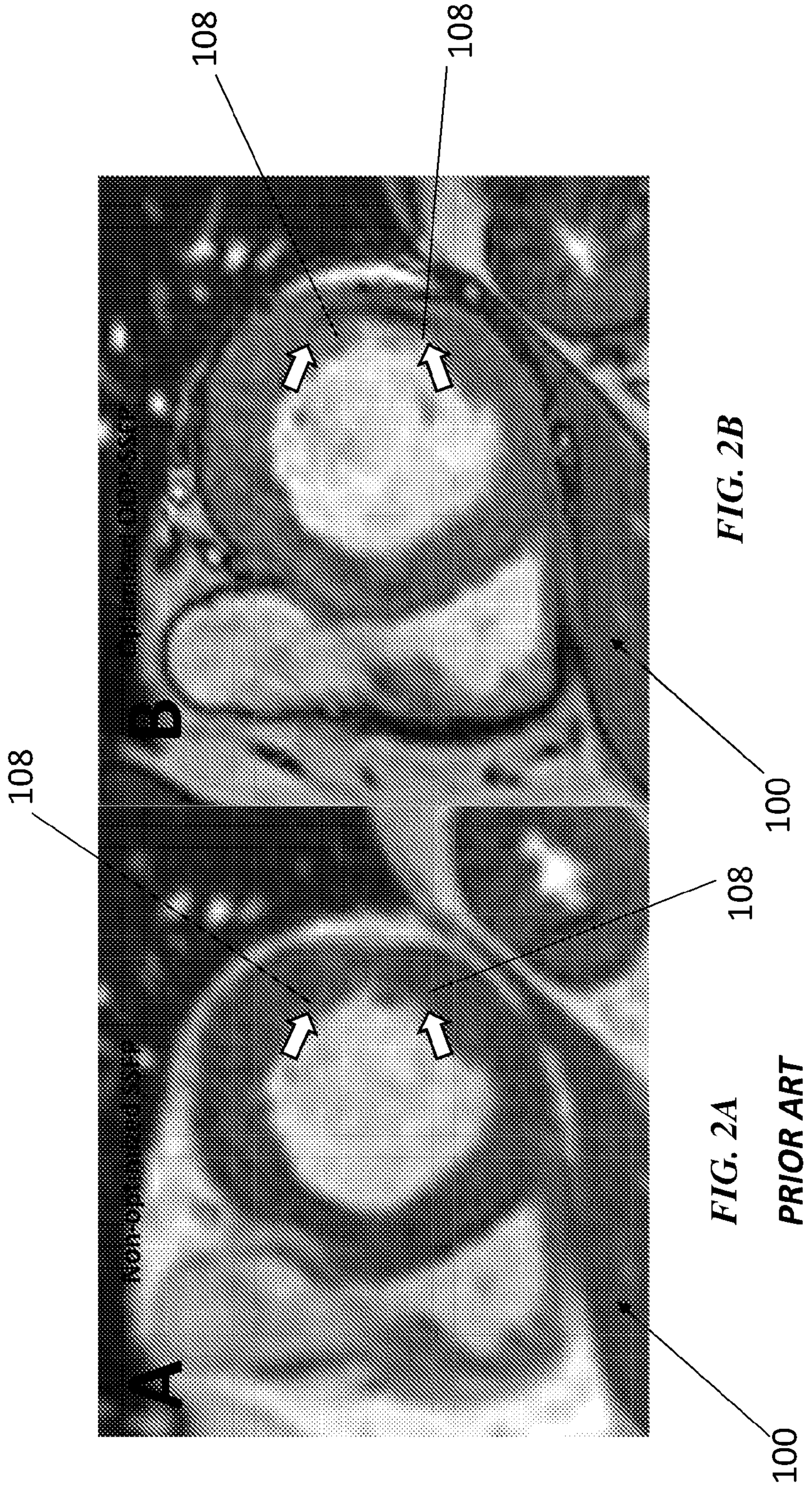
FIG. 2A PRIOR ART
FIG. 2A is a non-optimized, conventional prior art SSFP image attempting to illustrate minor degrees of fatty infiltration that is undetectable on conventional SSFP imaging.
FIG. 2B is an optimized out-of-phase (OOP) SSFP sequence detecting minor degrees of fatty infiltration that are undetectable in the image of FIG. 2A in accordance with one embodiment of the present disclosure.

FIG. 2A illustrates a non-optimized, conventional prior art SSFP image of the heart 100 that shows that lipomatous metaplasia (i.e., fatty metaplasia) can include an admixture of fat and fibrous tissue, which can result in voxels of tissue that are only partially fat throughout an entire infiltrated region 108. The partial fat infiltrated region 108 is typically undetectable using non-optimized conventional SSFP imaging (arrows). However, in accordance with the present disclosure, the partial fat infiltrated region 108 can become readily identifiable as a paradoxically dark intramyocardial region if the SSFP sequence is optimized so that fat signal is consistently "out-of-phase" (OOP) with water throughout the heart, as shown in FIG. 2B (arrows). Although "dark" zones are described herein as areas of partial fat in comparison to areas with higher signal intensity for normal tissue, it should be evident that there can be a different mapping of image intensities for display purposes. Examples of different mappings include linear or non-linear, and/or inverted mappings in grey-scale and/or any of numerous color look-up tables.

A unique feature of SSFP imaging as provided for herein is the repeating "passband" behavior of the magnetization. The period of these bands is 1/TR, where TR is the time to repeat, and the phase of adjacent bands alternates between 0° and 180°. When the chemical moiety of interest (such as the methylene group in fat) is chemically shifted in resonance frequency from the on-resonance chemical moiety (such as the protons in water), and these two chemical moieties are in passbands of opposite phase or MRI image voxels, containing a mixture of these two chemical moieties can have reduced or no signal. Hence, to be able to detect a mixture of these two chemical moieties (such as partial fat within the myocardium) as a focal region with reduced signal, the SSFP sequence has to be adjusted so that the chemical moiety of interest (e.g., fat) is in a passband out-of-phase with the other material (e.g., water). Accordingly, while techniques prior to the present disclosure would typically ignore findings that are a partial of a voxel during imaging, and/or would not try to detect such partial voxels during imaging, the present technique contrastingly identifies such partial voxels and leverages or otherwise uses them to help amplify and/or detect out-of-phase moieties.

In some embodiments of the present disclosure, two or more MRI images can be distinguished, or made different by one or more standard MRI parameters, to produce one or more parametric maps. Some non-limiting examples of MRI parameters can include inversion time, echo time, and/or preparation time, among others. The parametric maps can include a T1 map, a T2 map, and/or a T1rho map, among others.

Figure 3A:
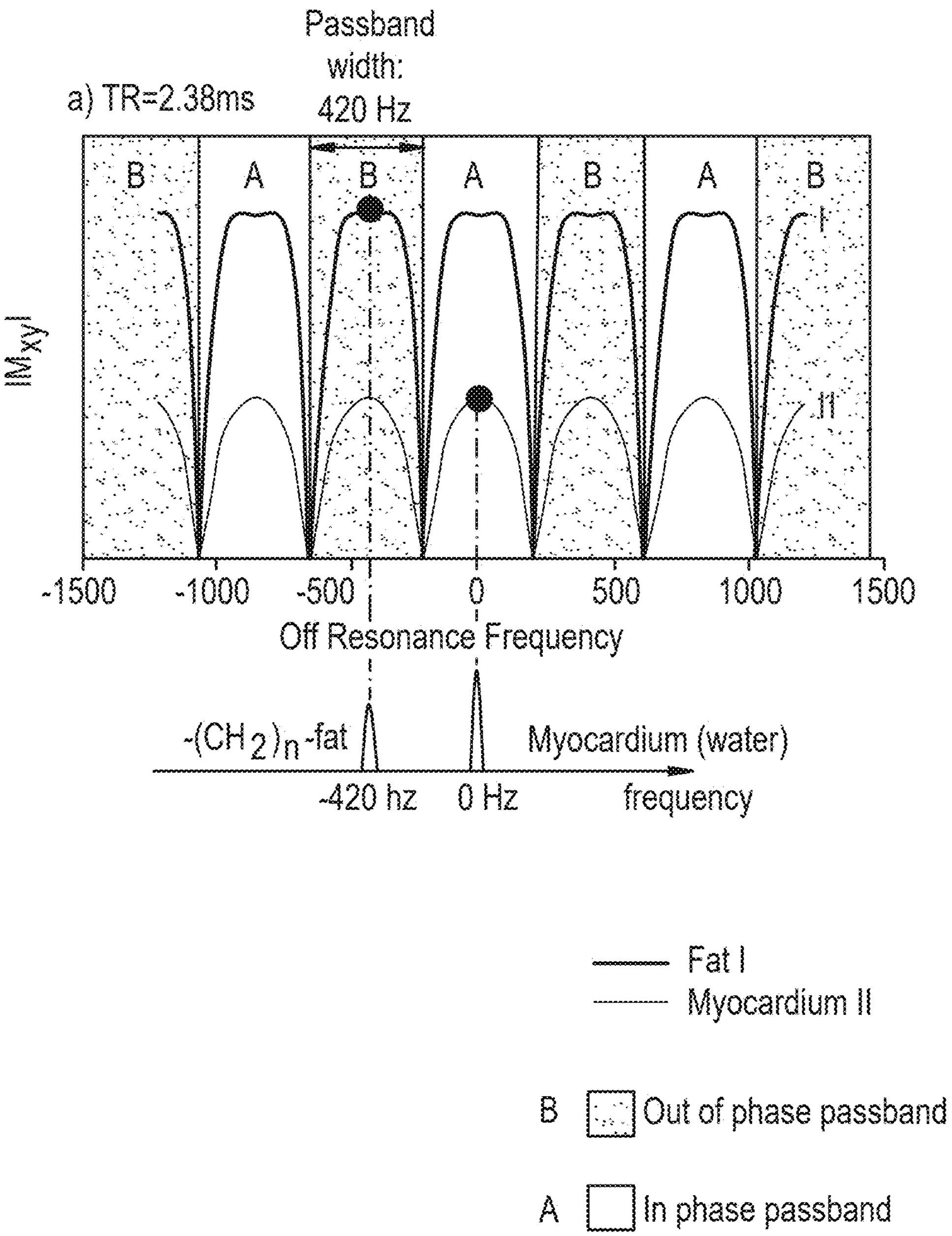
FIG. 3A is a graph illustrating an SSFP off-resonance response of fat and myocardium (without fat) at 3 T (tesla) at a time to repeat (TR) value of 2.38 milliseconds in accordance with one embodiment of the present disclosure.
Figure 3B:
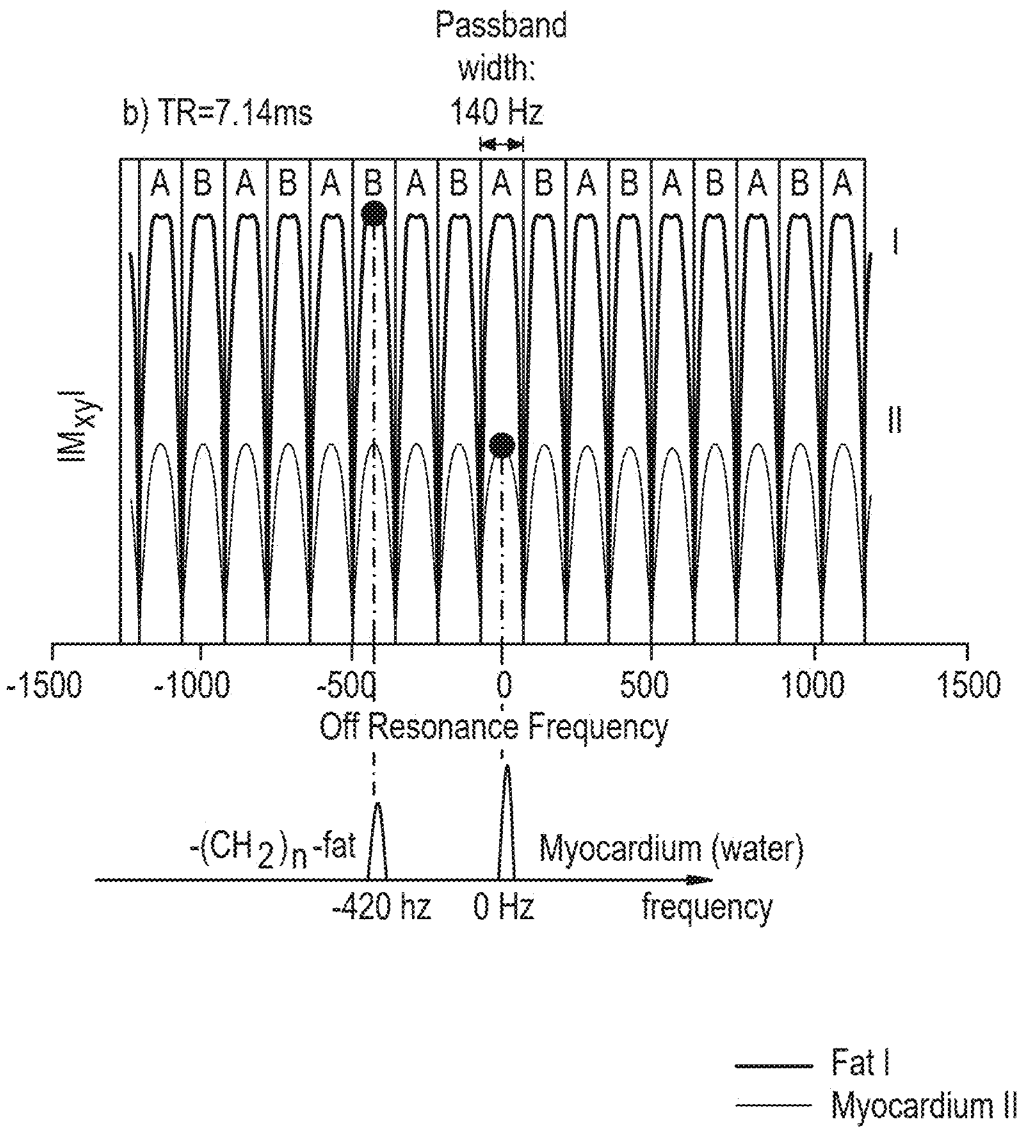
FIG. 3B is a graph illustrating an SSFP off-resonance response of fat and myocardium (without fat) at 3 T (tesla) at a TR value of 7.14 milliseconds in accordance with one embodiment of the present disclosure.

FIGS. 3A-3B illustrate the off-resonance response of fat (methylene peak) (curve I) and myocardium (without fat) (curve II) at 3 T. In the illustrated embodiment, region (A) represents in-phase (00 phase shift relative to water) and region (B) represents out-of-phase (1800 phase shift relative to water) passbands, respectively. Given that the frequency difference between fat and water is fixed for a given field strength (e.g., about 3.5 ppm or about 210 Hz for 1.5 T, about 420 Hz for 3 T), different choices of TR, also referred to as TR value herein, can center the main fat peak in different out-of-phase passbands. For example, assuming a fat-water frequency difference of about 420 Hz at 3 T, TRs of 2.38 ms (FIG. 3A) and 7.14 ms (FIG. 3B) can place the fat peak in the first (FIG. 3A) and second (FIG. 3B) out-of-phase passbands, respectively. However, longer TRs can result in narrower passbands and consequently imaging can become more sensitive to main magnetic field inhomogeneity (i.e., B0 inhomogeneity) at least because the frequency spread of fat across the heart may be greater than the passband width. Specifically, with a TR of 2.38 ms (assuming a fat-water frequency difference of about 420 Hz), the passband width can be about 420 Hz, and the distance from the centered fat peak to the border of the passband can be about 210 Hz. With a TR of 7.14 ms, the passband width can be reduced to about 140 Hz, and the distance to the passband border can be reduced to about 70 Hz.

Figure 4A:
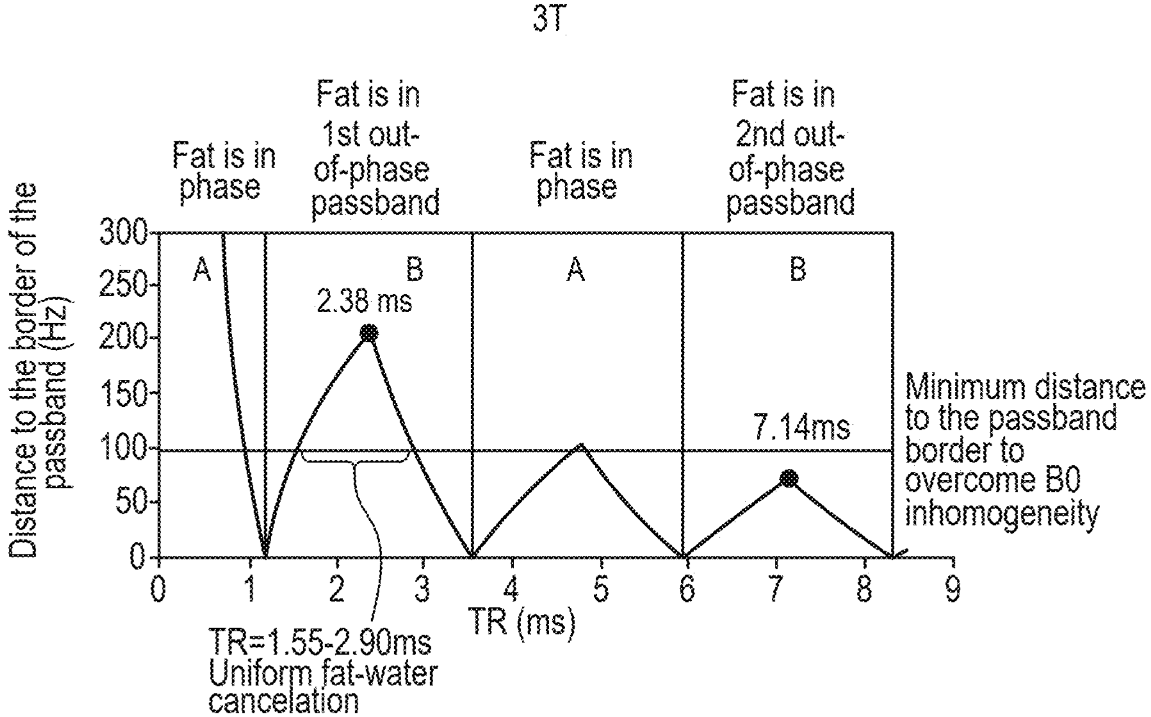
FIG. 4A is a graph illustrating the relationship between TR and a distance in frequency from a fat peak to a nearest passband border at 3 T in accordance with one embodiment of the present disclosure.
Figure 4B:
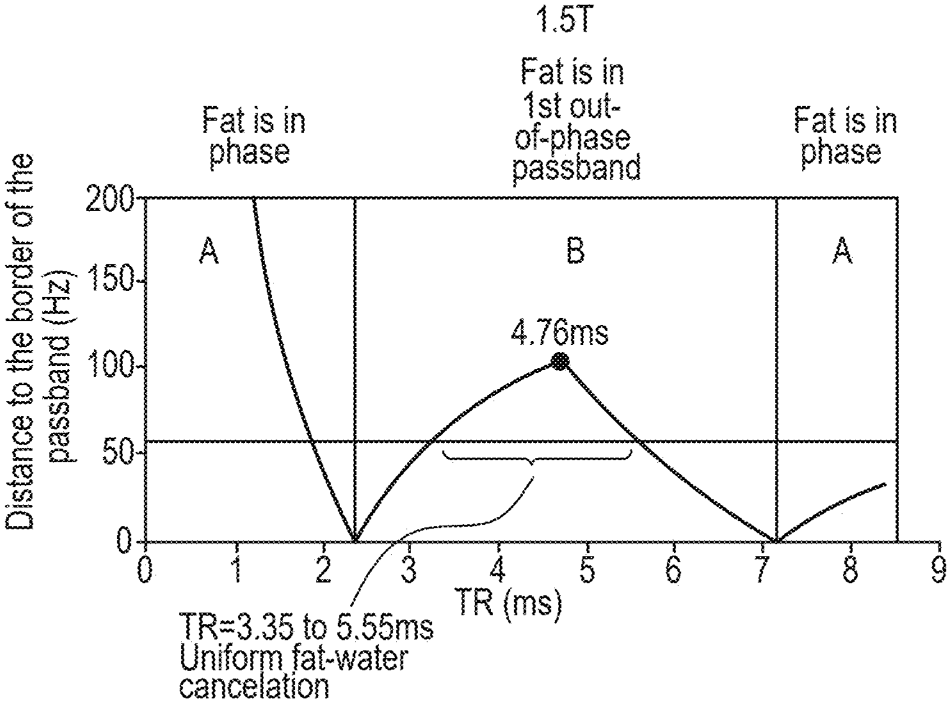
FIG. 4B is a graph illustrating the relationship between TR and a distance in frequency from a fat peak to a nearest passband border at 1.5 T in accordance with one embodiment of the present disclosure.

FIGS. 4A-4B illustrate the relationship between TR and the distance in frequency from the fat (methylene) peak to the nearest passband border. This distance dictates how much frequency spread due to B0 inhomogeneity can occur before some of the fat within the heart crosses the passband border into an in-phase passband, resulting in the absence of signal cancellation. The dots in FIGS. 4A-4B show the TR that places the fat peak optimally in the center of each out-of-phase passband (assuming a fat-water frequency difference of about 420 Hz at 3 T, and about 210 Hz at 1.5 T). At 1.5 T, only the first out-of-phase passband is shown as the second can use prohibitively long TRs (>12 ms) that will result in image artifacts and signal loss. The horizontal line displays a hypothetical "minimum distance condition" that can be necessary to obtain consistent fat-water cancellation throughout the heart. Prior studies suggest that B0 inhomogeneity can result in a frequency variation across the heart of up to 200 Hz at 3 T and 120 Hz at 1.5 T literature. Then, to first order, the minimum distance that is needed to obtain consistent fat-water cancellation throughout the heart would be half of the maximum frequency spread (about 100 Hz at 3 T, about 60 Hz at 1.5 T). Calculation of the range of acceptable TRs (ms) to meet this condition is given by the expression below.

Equation for Acceptable Range of TR:

$$\frac{1}{2(\Delta f_{fat-water} - MinDistanceCondition)} \leq TR \leq \frac{3}{2(\Delta f_{fat-water} + MinDistanceCondition)}$$

Assuming the accuracy of these values of B0 inhomogeneity across the heart imaging area, acceptable TRs can be approximately in the range of about 1.55 ms to about 2.90 ms at 3 T, and approximately in the range of about 3.35 ms to about 5.55 ms at 1.5 T. Based on these values, for imaging the heart and for which the chemically shifted species is the methylene group of fat, the hypothetical minimum distance condition is unlikely to be met if the fat peak is placed in the second out-of-phase passband at least because the passband width is likely to be too narrow.

Figure 5:
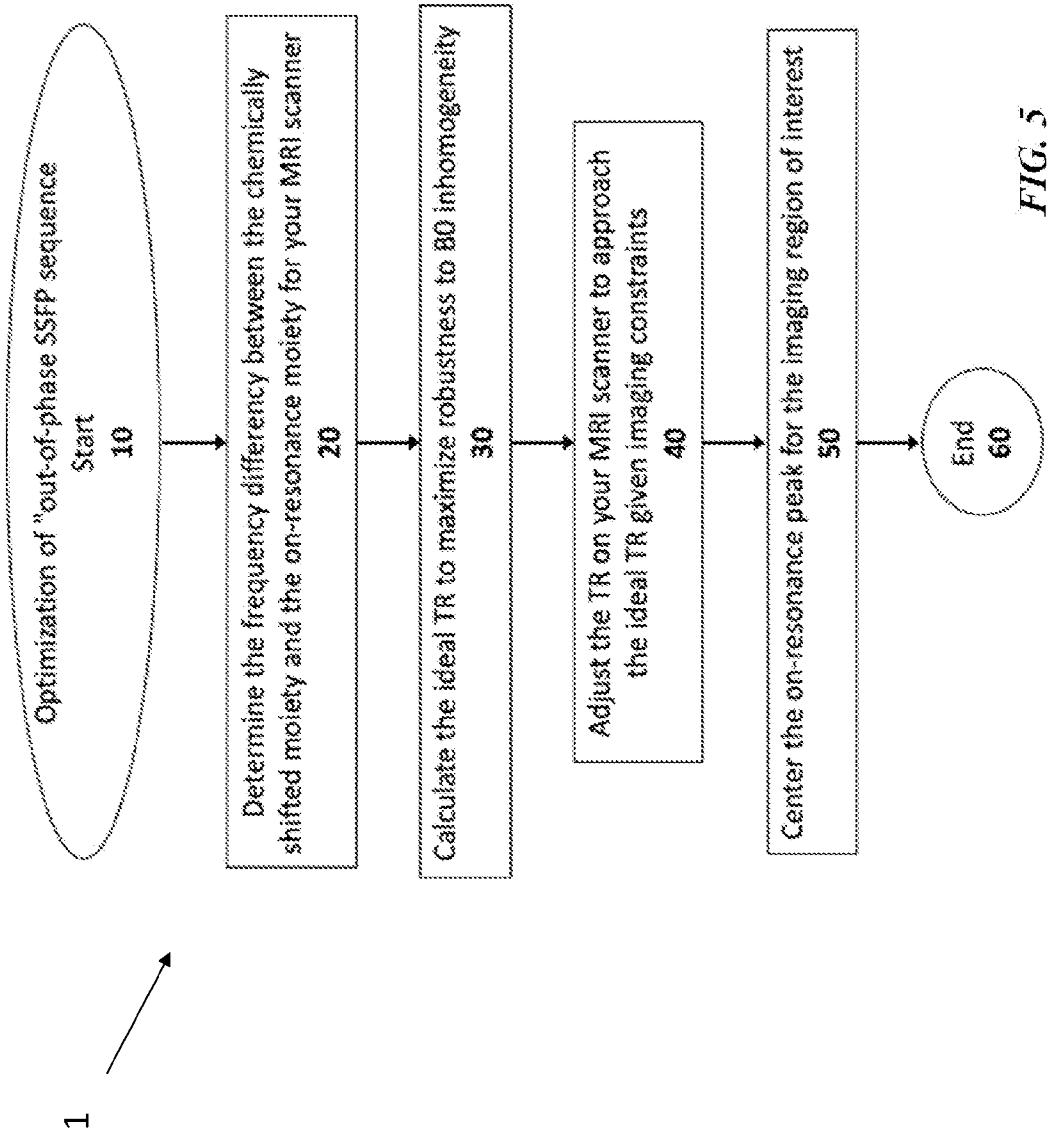
FIG. 5 is a flowchart of a process to optimize the SSFP sequence so that a chemically shifted moiety is out-of-phase with the on-resonance moiety for a target imaging region in accordance with one embodiment of the present disclosure.

FIG. 5 illustrates a flowchart 1 of a process that starts with optimization of the SSFP sequence (step or action 10) so that a chemically shifted moiety will be out-of-phase with the on-resonance moiety for a target imaging region. The target imaging region can be an organ (e.g., heart, liver, brain, etc.), part of an organ, or several organs in a region of the body (e.g., abdomen, thorax, etc.).

Following the start at step 10, in step or action 20, the frequency difference between the chemically shifted moiety and the on-resonance moiety for the specific MRI scanner that will be used can be determined. For example, if the chemically shifted moiety is the methylene group of fat and the on-resonance moiety is water, there are standard values in the literature for the frequency offset between fat and water (e.g., about 3.5 ppm or 210 about Hz for 1.5 tesla scanner, about 420 Hz for 3 tesla scanner). However, it is useful to be accurate during this step and there are differences from scanner to scanner even if they have nominally the same B0 magnetic field. For instance, different vendors may have a difference approximately in the range of about 1% to about 2% in main magnetic field strength for "3 T" scanners (e.g., 2.94 T rather than 3.00 T). This can result in about an 8 Hz difference in fat-water frequency offset (Δffat-water). Even for the same vendor model, during the ramp up process of the superconducting magnet, it is possible that there are small variations in how much current is added to the superconducting coils, resulting in small variations in magnetic field strength. Even for the same scanner, the current (and the magnetic field strength) slowly drifts down over a longer period of time (e.g. approximately four to five years) and the vendor service engineers generally perform a "micro" ramp back up to the upper limit. Based on the calculations above for imaging the heart, note that an approximately 10 Hz difference in Δffat-water can represent approximately 10% of the minimum frequency distance that can be used to obtain consistent fat-water cancellation at 3 T (about 17% at 1.5 T). Hence, directly measuring Δffat-water can allow the sequence to be specifically tailored to the scanner and can provide more robust fat-water signal cancellation.

In step or action 30, the ideal TR can be calculated to maximize robustness to B0 magnetic field inhomogeneity. The ideal TR can maximize robustness to B0 inhomogeneity by centering the peak of the chemically shifted moiety (for example the methylene group of fat) in the first out-of-phase passband (see FIGS. 3 and 4). In some embodiments, the peak of the chemically shifted moiety can be centered in a second or higher out-of-phase passband. Using the Δffat-water measured in step 20, the ideal TR (ms) is 1/Δffat-water (Hz). According to this formula, the ideal TR in the illustrative example can be 2.38 ms for a 3 T scanner and 4.76 ms for a 1.5 T scanner. Centering in the first out-of-phase passband can be more desirable than in the second out-of-phase passband at least because the passband width is greater, however, if the magnetic field is well shimmed, there can be low frequency variation across the target imaging region, or the moiety of interest can have a high chemical shift, and then centering in the second out-of-phase passband can be possible.

In step or action 40, the TR can be adjusted on the specific MRI scanner used to approach the ideal TR given imaging constraints. On most scanners, TR cannot be directly manipulated, but instead can be adjusted indirectly by changing other parameters such as bandwidth, radiofrequency (RF) pulse mode, and/or gradient mode. For example, if the ideal TR is 2.38 ms for a specific 3 T scanner, and the current TR for the SSFP cine sequence to be adjusted for out-of-phase imaging is 3.2 ms, increasing the bandwidth should drop the TR. Likewise, changing RF pulse mode from "normal" to "fast," or gradient slew rate from "fast" to "performance," and/or turning on asymmetric echo can also reduce the TR. Unfortunately, many of these changes can affect image quality, and there are also hardware constraints. Thus, it can be advantageous to approach the ideal TR while maintaining image quality, and TRs in the range that result in the main fat peak being more than the "minimum distance condition" from the nearest passband border can provide uniform fat-water cancellation throughout the target imaging region. As a specific example, if the chemically shifted moiety is the methylene group of fat, the on-resonance moiety is water, and the target imaging region is the heart, the minimum distance condition can be at approximately 100 Hz at 3 T and at approximately 60 Hz at 1.5 T as described above and shown in FIGS. 4A-4B. Calculation of the range of acceptable TRs (ms) to meet this condition is given by the equation above, and still following the illustrative example, the range of acceptable TRs can be approximately in the range of about 1.55 ms to about 2.90 ms for a 3 T scanner and approximately in the range of about 3.35 ms to about 5.55 ms for a 1.5 T scanner.

In step or action 50, the on-resonance peak can be centered for the target imaging region. For patients, a magnetic field shim can be performed over a local volume (e.g., box) encompassing the target imaging region. Even after localized shimming, the on-resonance moiety (e.g., water) can be off-resonance up to about 75 Hz at 3 T and about 50 Hz at 1.5 T for a specific target imaging region. Given that the frequency difference between the chemically shifted moiety and the on-resonance moiety can be fixed for a given field strength, centering the peak of the on-resonance moiety for the target imaging region (such as by directly changing the scanner center frequency) can be useful in calculating accurate frequency distances from the peak of the chemically shifted moiety to the out-of-phase passband border. On the other hand, if an appropriate TR cannot be reached in step 40, for instance because of hardware or other constraints, then an additional option can be to directly change the scanner center frequency for individual patients. This can move the peak of the chemically shifted moiety to a more central location in the out-of-phase passband, but at the expense of moving the peak of the on-resonance moiety closer to the in-phase passband border. Once the centering is completed, the process can end, as illustrated at step or action 60.

In some embodiments, after an ideal TR that centers the peak of the chemically shifted moiety in a passband that is in-phase with the on-resonance chemical moiety is calculated, the ideal TR that centers the peak of the chemically shifted moiety in the passband that is out-of-phase can be comprared to the ideal TR that centers the peak of the chemically shifted moiety in the passband that is in-phase. For example, in some embodiments, the ideal TR that centers the peak of the chemically shifted moiety in the passband that is out-of-phase can be subtracted from the ideal TR that centers the peak of the chemically shifted moiety in the passband that is in-phase. Performing such a comparison allows use of the in-phase passband to enhance the results of the out-of-phase passband and get further specificity therefrom.

The components of the process in FIG. 5 are not exclusive. Other components and processes may be derived in accordance with the principles of the present disclosure to accomplish the same objectives. The components may be implemented in hardware, software, by hand (e.g., by a MRI scanner operator), or a combination of these three. Although the present disclosure has been described with reference to particular embodiments, it is understood that the embodiments and variations shown and described herein are for illustration purposes only. Modifications to the current design may be implemented by those skilled in the art, without departing from the scope of the present disclosure.

It is also worth noting that while one or more of the steps or actions described with respect to FIG. 5 may be actions that those skilled in the art are aware of and/or may have even performed in some context, including some contexts while imaging, in isolation, the combination of these steps or actions, and for use as described herein to provide more clarity in imaging, is not a way in which such steps or actions have ever been combined. By way of example, to the extent SSFP sequences have been used in the context of imaging, including MRI, at least because of the high signal to noise ratio that SSFP sequences produce, the use of SSFP sequences is not an action that has been used to detect different moieties prior to the present disclosure. The fact that using such sequences in this manner produced such useful imaging was surprising at least because of the high signal to noise ratio associated with SSFP sequences. By way of further example, to the extent measuring TR values has been used in the context of imaging, including MRI, the goal traditionally has been to try and get the shortest TR value as possible so the imaging or other action can be performed as quickly as possible. Accordingly, prior to the present disclosures, consideration was not given to setting TR values to impact phases such as putting a moiety out of phase.

At least in clinical MRIs, typically what is trying to be detected is water, while other chemicals are trying to be removed. The chemical(s) are essentially an artifact. In contrast, the techniques described in FIG. 5 are aimed to utilize information detected about chemicals to the advantage of the clinician. Rather than being an artifact, the chemicals are detected and used to provide chemical moiety shifting. For example, interfaces between chemically shifted and on-resonance moieties (e.g., fat-water interfaces) at which signal cancellation occurs to form black areas and/or regions may be used within the methods of the present disclosure. In view of the present disclosures, clinicians will now be concerned about off-resonance moieties.

Figure 6A:
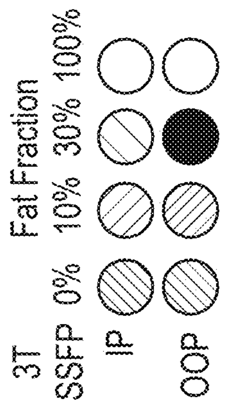
FIG. 6A demonstrates in-phase (IP) and out-of-phase (OOP) SSFP images of test-tubes containing 0%, 10%, 30%, and 100% fat fraction following the optimization process of FIG. 5 in accordance with one embodiment of the present disclosure.
Figure 6B:
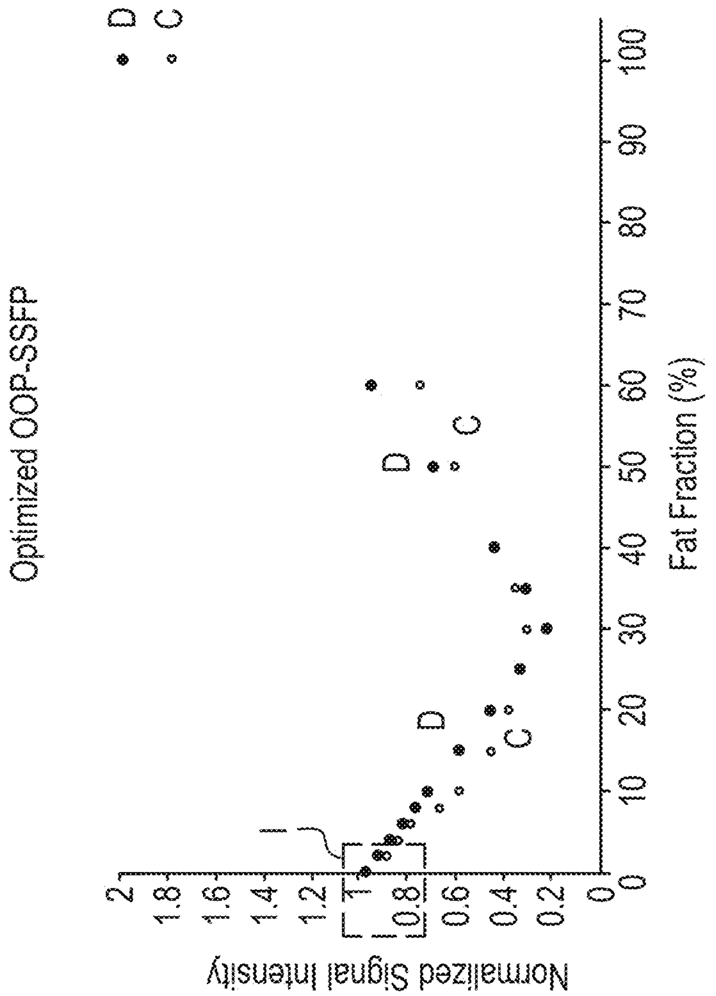
FIG. 6B is a graph illustrating an optimized OOP-SSFP as a function of normalized signal intensity versus fat fraction in fifteen test tubes, each with a different fat fraction, normalized to a tube with 0% fat fraction at 3 T in accordance with one embodiment of the present disclosure
Figure 6C:
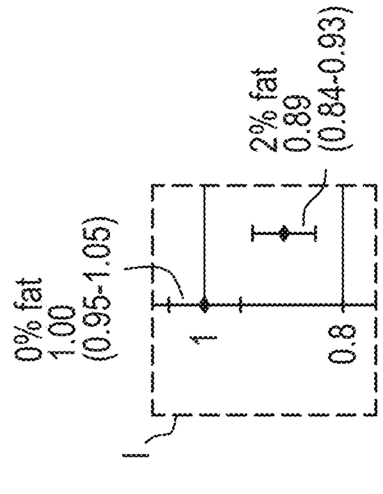
FIG. 6C is a magnified view of a measured signal intensity from two test tubes identified in FIG. 6B.

As a non-limiting illustrative example, FIGS. 6A-6C show the results of a phantom experiment depicting the sensitivity of the optimized SSFP sequence to detecting a mixture of fat and water. FIG. 6A demonstrates in-phase (IP) and out-of-phase (OOP) SSFP images (following the optimization process shown in FIG. 5) of test-tubes containing 0%, 10%, 30%, and 100% fat fraction. As expected, the OOP-SSFP images demonstrate signal reduction in tubes containing partial fat (e.g., 10% or 30% fat fraction) compared to the tube with 0% fat. Conversely, IP-SSFP images do not result in any detectable degree of signal intensity reduction in tubes containing partial fat (e.g., 10% or 30% fat fraction) compared to the tube with 0% fat.

FIG. 6B illustrates the measured mean signal intensity in 15 test-tubes, each with different fat-fraction, normalized to the tube with 0% fat using the OOP-SSFP sequence at 3 T (dots C). There was good agreement with simulated signal intensity values calculated using Bloch equations (dots D). FIG. 6C illustrates a magnified view of the measured signal intensity I from two test-tubes, as an example, from the data of FIG. 6B. A fat fraction of about 2% can result in a significant reduction in signal intensity as compared to the reference tube with 0% fat with no overlap of about 95% confidence intervals (0.89 [95% CI 0.84-0.93] versus 1.00 [95% CI 0.95-1.05]). As shown in this example, the present embodiments can be sensitive to small concentrations of a chemically shifted moiety (as part of a mixture with water, the on-resonance moiety) due to having the ability to discern fat fractions as low as about 2%.

Figure 7A:
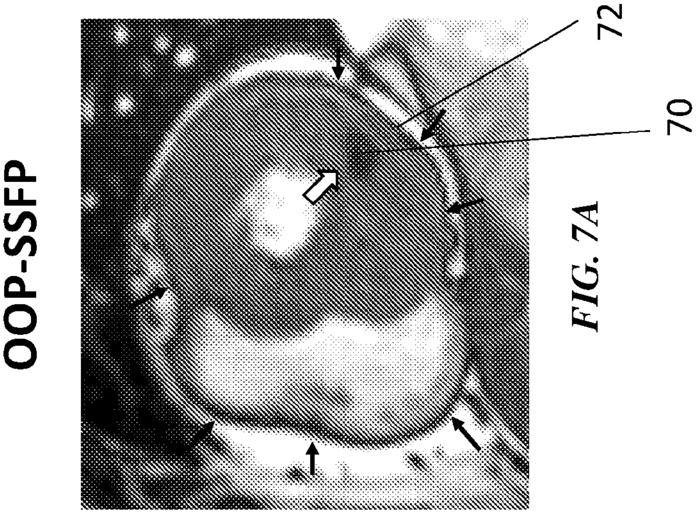
FIG. 7A is an image illustrating an example of a patient with intramyocardial fatty infiltration that was identified on out-of-phase (OOP) SSFP imaging in accordance with one embodiment of the present disclosure.
Figure 7B:
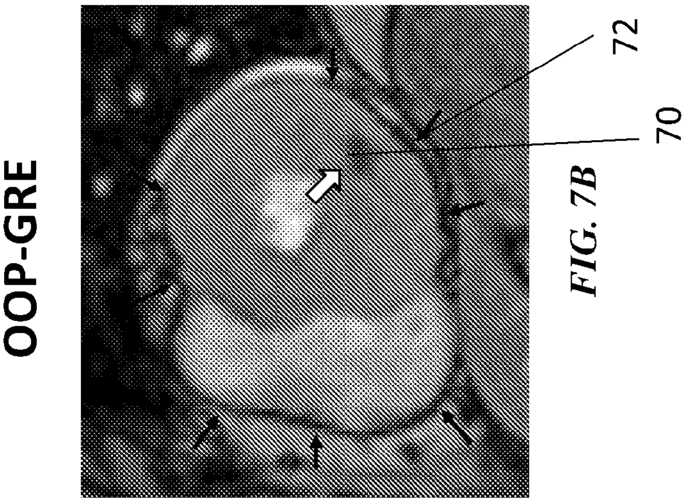
FIG. 7B is an image illustrating an example of the myocardial fatty infiltration of FIG. 7A on out-of-phase gradient recalled echo (OOP-GRE) imaging in accordance with one embodiment of the present disclosure.
Figure 7C:
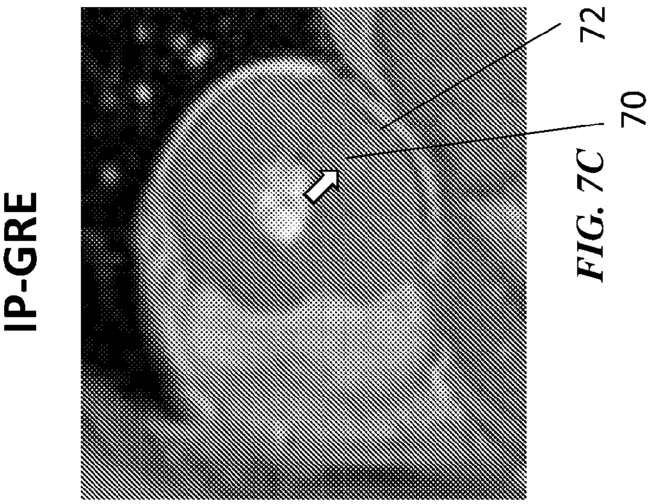
FIG. 7C is an image illustrating an example of the myocardial fatty infiltration of FIG. 7A on in-phase gradient recalled echo (IP-GRE) imaging in accordance with one embodiment of the present disclosure.

As another illustrative example, FIGS. 7A-7C show an example of a patient with intramyocardial fatty infiltration that was identified on out-of-phase (OOP) SSFP imaging, following the optimization process shown in FIG. 5. As shown in FIG. 7A, a focal dark region 70 in the left ventricular inferior wall (larger arrow) can be partially fat, as confirmed by DIXON imaging. Specifically, the same region, e.g., focal dark region 70, can have low signal on out-of-phase gradient recalled echo (OOP-GRE) imaging, as shown in FIG. 7B, and higher signal on in-phase gradient recalled echo (IP-GRE) imaging, as shown in FIG. 7C. Moreover, a dark line 72 of signal cancellation can be seen along an entire interface between myocardium and epicardial fat on both OOP-SSFP and OOP-GRE images (highlighted by small arrows), but can be absent on in-phase GRE images. This demonstrates that the optimized SSFP sequence can be consistently out-of-phase throughout the target imaging region of interest because there can be a phase cancellation line between the chemically shifted moiety (in this case, fat) and the on-resonance moiety (in this case, water) throughout the entire heart imaging area. As shown in this example, the present embodiments can be useful in improving the visualization of myocardial fatty infiltration. As already indicated, however, these embodiments are not limited to imaging the heart, nor limited to detecting mixtures of fat, and can be useful in imaging any mixture of a chemically shifted moiety with an on-resonance moiety for any targeted imaging region of interest.

In some embodiments, a contrast agent can be added to shift the chemically shifted moiety. The contrast agent can be administered intravenously, by mouth, in tablet form, or via another avenue known to one skilled in the art. Once administered, the contrast agent can facilitate a chemical shift in tissue with high perfusion as compared to tissue with low blood perfusion, which can allow the differentiation of tissue with "normal" and "abnormal" blood perfusion. Some non-limiting examples of the contrast agent can include a magnetic susceptibility contrast agent (e.g., dysprosium complexes or ferromagnetic particles).

The systems and methods described herein can be implemented in hardware, software, firmware, or combinations of hardware, software and/or firmware. In some examples, the systems and methods described in this specification may be implemented using a non-transitory computer readable medium storing computer executable instructions that when executed by one or more processors of a computer cause the computer to perform operations. Computer readable media suitable for implementing the systems and methods described in this specification include non-transitory computer-readable media, such as disk memory devices, chip memory devices, programmable logic devices, random access memory (RAM), read only memory (ROM), optical read/write memory, cache memory, magnetic read/write memory, flash memory, and application-specific integrated circuits. In addition, a computer readable medium that implements a system or method described in this specification may be located on a single device or computing platform or may be distributed across multiple devices or computing platforms.

Figure 8:
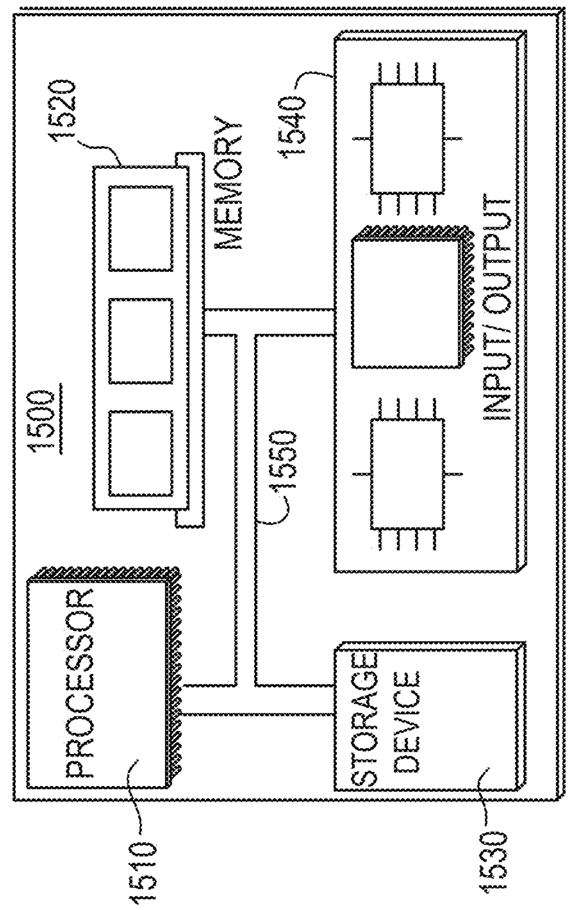
FIG. 8 is a schematic diagram of one exemplary embodiment of a computer system upon which the control system of the present disclosures can be built.

In some embodiments, the systems of the present embodiments can be coupled and/or otherwise associated with a controller configured to image chemically shifted and on-resonance moieties, determine frequency differences, and/or calculate and/or adjust ideal TR values, such configurations being understood in view of the present disclosures. FIG. 8 is a block diagram of one exemplary embodiment of a computer system 1500 upon which the controller or control system of the present disclosures can be built, performed, trained, etc. For example, any of the devices discussed herein can be examples of the system 1500 described herein. The system 1500 can include a processor 1510, a memory 1520, a storage device 1530, and an input/output device 1540. Each of the components 1510, 1520, 1530, and 1540 can be interconnected, for example, using a system bus 1550. The processor 1510 can be capable of processing instructions for execution within the system 1500. The processor 1510 can be a single-threaded processor, a multi-threaded processor, or similar device. The processor 1510 can be capable of processing instructions stored in the memory 1520 or on the storage device 1530. The processor 1510 may execute operations such as, by way of non-limiting examples, starting and stopping imaging processes, acquiring image data, and/or control system configurations that can be automatic, in response to various parameters, and/or manually controlled by a user, including in response to signals/parameters/etc., and so forth, and/or based on observation/preference, and so forth, among other features described in conjunction with the present disclosure. The controller 1500 can optimize operation in response to the images and calculations performed by the devices and systems disclosed herein. The controller 1500 may further embed machine-learning techniques, artificial intelligence, and/or digital twinning that can aid in improving performance.

The memory 1520 can store information within the system 1500. In some implementations, the memory 1520 can be a computer-readable medium. The memory 1520 can, for example, be a volatile memory unit or a non-volatile memory unit. In some implementations, the memory 1520 can store information related to frequencies and/or sequences used, and so forth.

The storage device 1530 can be capable of providing mass storage for the system 1500. In some implementations, the storage device 1530 can be a non-transitory computer-readable medium. The storage device 1530 can include, for example, a hard disk device, an optical disk device, a solid-date drive, a flash drive, magnetic tape, and/or some other large capacity storage device. The storage device 1530 may alternatively be a cloud storage device, e.g., a logical storage device including multiple physical storage devices distributed on a network and accessed using a network. In some implementations, the information stored on the memory 1520 can also or instead be stored on the storage device 1530.

The input/output device 1540 can provide input/output operations for the system 1500. In some implementations, the input/output device 1540 can include one or more of network interface devices (e.g., an Ethernet card or an InfiniBand interconnect), a serial communication device (e.g., an RS-232 10 port), and/or a wireless interface device (e.g., a short-range wireless communication device, an 802.7 card, a 3G wireless modem, a 4G wireless modem, a 5G wireless modem). In some implementations, the input/output device 1540 can include driver devices configured to receive input data and send output data to other input/output devices, e.g., a keyboard, a printer, and/or display devices. In some implementations, mobile computing devices, mobile communication devices, and other devices can be used.

In some implementations, the system 1500 can be a microcontroller. A microcontroller is a device that contains multiple elements of a computer system in a single electronics package. For example, the single electronics package could contain the processor 1510, the memory 1520, the storage device 1530, and/or input/output devices 1540.

Although an example processing system has been described above, implementations of the subject matter and the functional operations described above can be implemented in other types of digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible program carrier, for example a computer-readable medium, for execution by, or to control the operation of, an MRI imaging system. The computer readable medium can be a machine-readable storage device, a machine-readable storage substrate, a memory device, a composition of matter effecting a machine-readable propagated signal, or a combination of one or more of them.

Various embodiments of the present disclosure may be implemented at least in part in any conventional computer programming language. For example, some embodiments may be implemented in a procedural programming language (e.g., "C" or ForTran95), in an object-oriented programming language (e.g., "C++"), and/or other programming languages (e.g. Java, JavaScript, PHP, Python, and/or SQL). Other embodiments may be implemented as a pre-configured, stand-along hardware element and/or as preprogrammed hardware elements (e.g., application specific integrated circuits, FPGAs, and digital signal processors), or other related components.

The term "computer system" may encompass all apparatus, devices, and machines for processing data, including, by way of non-limiting examples, a programmable processor, a computer, or multiple processors or computers. A processing system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, executable logic, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Such implementation may include a series of computer instructions fixed either on a tangible, non-transitory medium, such as a computer readable medium. The series of computer instructions can embody all or part of the functionality previously described herein with respect to the system. Computer readable media suitable for storing computer program instructions and data include all forms of non-volatile or volatile memory, media and memory devices, including by way of example semiconductor memory devices, e.g., EPROM, EEPROM, and flash memory devices; magnetic disks, e.g., internal hard disks or removable disks or magnetic tapes; magneto optical disks; and CD-ROM and DVD-ROM disks. The processor and the memory can be supplemented by, or incorporated in, special purpose logic circuitry. The components of the system can be interconnected by any form or medium of digital data communication, e.g., a communication network. Examples of communication networks include a local area network ("LAN") and a wide area network ("WAN"), e.g., the Internet.

Those skilled in the art should appreciate that such computer instructions can be written in a number of programming languages for use with many computer architectures or operating systems. Furthermore, such instructions may be stored in any memory device, such as semiconductor, magnetic, optical, or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). In fact, some embodiments may be implemented in a software-as-a-service model ("SAAS") or cloud computing model. Of course, some embodiments of the present disclosure may be implemented as a combination of both software (e.g., a computer program product) and hardware. Still other embodiments of the present disclosure are implemented as entirely hardware, or entirely software.

One skilled in the art will readily appreciate that the present disclosure is well adapted to carry out the objects and obtain the ends and advantages mentioned, as well as those inherent therein. The present disclosure described herein are presently representative of preferred embodiments, are exemplary, and are not intended as limitations on the scope of the present disclosure. Changes therein and other uses will occur to those skilled in the art that are encompassed within the spirit of the present disclosure as defined by the scope of the claims.

No admission is made that any reference, including any non-patent or patent document cited in this specification, constitutes prior art. In particular, it will be understood that, unless otherwise stated, reference to any document herein does not constitute an admission that any of these documents forms part of the common general knowledge in the art in the United States or in any other country. Any discussion of the references states what their authors assert, and the applicant reserves the right to challenge the accuracy and pertinence of any of the documents cited herein. All references cited herein are fully incorporated by reference, unless explicitly indicated otherwise. The present disclosure shall control in the event there are any disparities between any definitions and/or description found in the cited references.

Examples of the above-described embodiments can include the following:

1. A method of magnetic resonance imaging to depict mixtures of chemically shifted and on-resonance moieties depicted in imaging, the method comprising:
   - applying a steady-state free precession sequence during operation of a magnetic resonance imaging (MRI) scanner;
   - determining a frequency difference between a chemically shifted moiety of a mixture and an on-resonance moiety of the mixture for the MRI scanner;
   - calculating an ideal time to repeat (TR) value that centers a peak of the chemically shifted moiety in a passband that is out-of-phase with the on-resonance moiety;
   - adjusting a TR value so that it approaches the ideal TR value in view of one or more constraints of the MRI scanner and so it is within an acceptable range of TR values whereby the centered peak of the chemically shifted moiety is a distance in frequency to a nearest passband border at least half that anticipated to be a spread in frequency due to B0 inhomogeneity for a target imaging region; and
   - acquiring MRI data from the target imaging region after centering the on-resonance peak for the target imaging region.

2. The method of claim 1, wherein the chemically shifted moiety of interest is a component of fat.

3. The method of claim 1, wherein the chemically shifted moiety of interest is not a component of fat.

4. The method of any of claims 1 to 3, wherein the chemically shifted moiety of interest is chemically shifted by administering a contrast agent.

5. The method of any of claims 1 to 4, wherein calculating an ideal TR value that centers the peak of the chemically shifted moiety further comprises centering the peak of the chemically shifted moiety in the first out-of-phase passband.

6. The method of any of claims 1 to 5, wherein calculating an ideal TR value that centers the peak of the chemically shifted moiety further comprises centering the peak of the chemically shifted moiety in the second or higher out-of-phase passband.

7. The method of any of claims 1 to 6, further comprising distinguishing two or more MRI images by one or more of inversion time, echo time, or preparation time to produce one or more parametric maps.

8. The method of claim 7, wherein the one or more parametric maps comprise at least one of a T1 map, a T2 map, or a T1rho map.

9. A method of magnetic resonance imaging to depict mixtures of chemically shifted and on-resonance moieties depicted in imaging, the method comprising:

- applying a steady-state free precession sequence during operation of a magentic resonance imaging (MRI) scanner;
- determining a frequency difference between a chemically shifted moiety of a mixture and an on-resonance moiety of the mixture for the MRI scanner;
- calculating an ideal time to repeat (TR) value that centers a peak of the chemically shifted moiety in a passband that is in-phase with the on-resonance moiety;
- adjusting a TR value so that it approaches the ideal TR value in view of one or more constraints of the MRI scanner and so it is within an acceptable range of TR balues whereby the centered peak of the chemically shifted moiety is a distance in frequency to a nearest passband border at least half that anticipated to be a spread in frequency due to B0 inhomogeneity for a target imaging region; and
- acquiring MRI data from the target imaging region after centering the on-resonance peak for the target imaging region.

10. The method of claim 9, wherein calculating an ideal TR value that centers the peak of the chemically shifted moiety further comprises centering the peak of the chemically shifted moiety in the first in-phase passband.

11. The method of claim 9 or claim 10, wherein calculating an ideal TR value that centers the peak of the chemically shifted moiety further comprises centering the peak of the chemically shifted moiety in the second or higher in-phase passband.

12. The method of any of claims 9 to 11, wherein the ideal TR value is a first ideal TR value, the method further comprising:

- calculating a second ideal TR value that centers a peak of the chemically shifted moiety in a passband that is out-of-phase with the on-resonance moiety; and
- subtracting the first ideal TR value from the second ideal TR value.

One skilled in the art will appreciate further features and advantages of the disclosures based on the provided for descriptions and embodiments. Accordingly, the inventions are not to be limited by what has been particularly shown and described. All publications and references cited herein are expressly incorporated herein by reference in their entirety.

What is claimed is:

1. A method of magnetic resonance imaging to depict mixtures of chemically shifted and on-resonance moieties depicted in imaging, the method comprising:

- applying a steady-state free precession sequence during operation of a magnetic resonance imaging (MRI) scanner;
- determining a frequency difference between a chemically shifted moiety of a mixture and an on-resonance moiety of the mixture for the MRI scanner;
- calculating an ideal time to repeat (TR) value that centers a peak of the chemically shifted moiety in a passband that is out-of-phase with the on-resonance moiety;
- adjusting a TR value so that it approaches the ideal TR value in view of one or more constraints of the MRI scanner and so it is within an acceptable range of TR values whereby the centered peak of the chemically shifted moiety is a distance in frequency to a nearest passband border at least half that anticipated to be a spread in frequency due to B0 inhomogeneity for a target imaging region; and
- acquiring MRI data from the target imaging region after centering the on-resonance peak for the target imaging region.

2. The method of claim 1, wherein the chemically shifted moiety of interest is a component of fat.

3. The method of claim 1, wherein the chemically shifted moiety of interest is not a component of fat.

4. The method of claim 1, wherein the chemically shifted moiety of interest is chemically shifted by administering a contrast agent.

5. The method of claim 1, wherein calculating an ideal TR value that centers the peak of the chemically shifted moiety further comprises centering the peak of the chemically shifted moiety in the first out-of-phase passband.

6. The method of claim 1, wherein calculating an ideal TR value that centers the peak of the chemically shifted moiety further comprises centering the peak of the chemically shifted moiety in the second or higher out-of-phase passband.

7. The method of claim 1, further comprising distinguishing two or more MRI images by one or more of inversion time, echo time, or preparation time to produce one or more parametric maps.

8. The method of claim 7, wherein the one or more parametric maps comprise at least one of a T1 map, a T2 map, or a T1rho map.

9. A method of magnetic resonance imaging to depict mixtures of chemically shifted and on-resonance moieties depicted in imaging, the method comprising:

- applying a steady-state free precession sequence during operation of a magnetic resonance imaging (MRI) scanner;
- determining a frequency difference between a chemically shifted moiety of a mixture and an on-resonance moiety of the mixture for the MRI scanner;
- calculating an ideal time to repeat (TR) value that centers a peak of the chemically shifted moiety in a passband that is in-phase with the on-resonance moiety;
- adjusting a TR value so that it approaches the ideal TR value in view of one or more constraints of the MRI scanner and so it is within an acceptable range of TR values whereby the centered peak of the chemically shifted moiety is a distance in frequency to a nearest passband border at least half that anticipated to be a spread in frequency due to B0 inhomogeneity for a target imaging region; and acquiring MRI data from the target imaging region after centering the on-resonance peak for the target imaging region.

10. The method of claim 9, wherein calculating an ideal TR value that centers the peak of the chemically shifted moiety further comprises centering the peak of the chemically shifted moiety in the first in-phase passband.

11. The method of claim 9, wherein calculating an ideal TR value that centers the peak of the chemically shifted moiety further comprises centering the peak of the chemically shifted moiety in the second or higher in-phase passband.

12. The method of claim 9, wherein the ideal TR value is a first ideal TR value, the method further comprising:

calculating a second ideal TR value that centers a peak of the chemically shifted moiety in a passband that is out-of-phase with the on-resonance moiety; and subtracting the first ideal TR value from the second ideal TR value.

* * * * *